United States Patent
Hubbard et al.

(10) Patent No.: US 9,519,221 B2
(45) Date of Patent: Dec. 13, 2016

(54) METHOD FOR MICROWAVE PROCESSING OF PHOTOSENSITIVE POLYIMIDES

(71) Applicant: Applied Materials, Inc., Santa Clara, CA (US)

(72) Inventors: Robert L. Hubbard, Eugene, OR (US); Iftikhar Ahmad, Raleigh, NC (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/544,482

(22) Filed: Jan. 12, 2015

(65) Prior Publication Data

US 2015/0198890 A1 Jul. 16, 2015

Related U.S. Application Data

(60) Provisional application No. 61/964,748, filed on Jan. 13, 2014.

(51) Int. Cl.

| G03F 7/26 | (2006.01) |
| G03F 7/38 | (2006.01) |
| H01L 21/02 | (2006.01) |
| H01L 21/311 | (2006.01) |
| G03F 7/038 | (2006.01) |
| G03F 7/40 | (2006.01) |
| B05D 3/06 | (2006.01) |
| B05D 3/02 | (2006.01) |

(52) U.S. Cl.
CPC ............... *G03F 7/38* (2013.01); *G03F 7/0387* (2013.01); *G03F 7/40* (2013.01); *H01L 21/02118* (2013.01); *H01L 21/02337* (2013.01); *H01L 21/311* (2013.01); *B05D 3/029* (2013.01); *B05D 3/06* (2013.01); *B05D 2505/50* (2013.01)

(58) Field of Classification Search
CPC ..................................... G03F 7/26; G03F 7/40
See application file for complete search history.

(56) References Cited

U.S. PATENT DOCUMENTS

| 4,093,461 A * | 6/1978 | Loprest ................. G03F 7/0233 430/192 |
| 2002/0098444 A1* | 7/2002 | Sasaki .................... C08G 73/10 430/270.1 |
| 2014/0343223 A1* | 11/2014 | Reinerth ............ C08G 73/1032 524/600 |

\* cited by examiner

*Primary Examiner* — Kathleen Duda
(74) *Attorney, Agent, or Firm* — Moser Taboada; Alan Taboada

(57) ABSTRACT

A method for curing photosensitive polyimide (PSPI) films includes the steps of: depositing a PSPI film on a selected substrate, and curing the film by microwave heating at a selected temperature from about 200 to 340° C. in a selected atmosphere containing an oxygen concentration from about 20 to 200,000 ppm. The process atmosphere may be static or flowing. The addition of oxygen improves the removal of acrylate residue and improves the $T_g$ of the cured film, while the low processing temperature characteristic of the microwave process prevents the oxygen from damaging the polyimide backbone. The method may further include the steps of photopatterning and developing the PSPI film prior to curing. The process is particularly suitable for dielectric films on silicon for electronic applications.

16 Claims, 8 Drawing Sheets

METHOD FOR MICROWAVE PROCESSING OF PHOTOSENSITIVE POLYIMIDES

CROSS REFERENCE TO RELATED APPLICATION

This application claims the benefit of Provisional Application Ser. No. 61/964,748, filed Jan. 13, 2014 by the present inventors, the entire disclosure of which is incorporated herein by reference.

BACKGROUND OF THE INVENTION

Field of the Invention

The invention pertains to apparatus and methods for materials processing using microwave energy. More particularly, it pertains to methods for processing photosensitive polyimide (PSPI) films for electronic devices.

Description of Related Art

The use of microwave (MW) energy to enhance the speed of chemical reactions is well known and documented. This unique method of producing heat may cause either the energy of activation ($E_a$) to be reduced or the kinetics (f and p in Equation 1) of the combination of reactants to increase [see D. A. Lewis, J. D. Summers, T. C. Ward, and J. E. McGrath, "Accelerated Imidization Reactions using Microwave Radiation", *Journal of Polymer Science: Part A; Polymer Chemistry*, Vol. 30, 1647-53 (1992)]. It has also been suggested in the chemical literature [see J. Mijovic and J. Wijaya, "Comparative Calorimetric Study of Epoxy Cure by Microwave vs. Thermal Cure", *Macromolecules* 23:3671 (1990), and J. Mijovic, A. Fishbain, and J. Wijaya, "Mechanistic Modeling of Epoxy-Amine Kinetics: 2—Comparison of Kinetics in Thermal and Microwave Fields", *Macromolecules* 25:986 (1992)] that microwave energy would not be practically and commercially feasible but the last two decades has seen the adoption of microwave energy for curing many important resins in a wide range of applications. Some of this contradiction lies in the counter-intuitive nature of the mechanism of microwave heating. Further, even a sound understanding of this mechanism does not anticipate some of the surprises and fortunate opportunities microwave energy offers.

$$k = fp\exp[E_a/RT] \qquad \text{Equation 1}$$

The fundamental heating methods of conduction, induction, and convection involve the transfer of heat between one group of more energetic molecules to another group of molecules with less energy by random collision. These collisions are physically sequential and independent of the structure of the molecules other than their bulk enthalpies of heating ($\Delta H$). In contrast, MW irradiation has high penetration depth in many materials of interest (including polymers) which eliminates the necessity of sequential interactions of neighboring molecules in standard heat transfer methods. MW heating solely depends on dielectric relaxation in polarizable bonds which causes dipolar rotation of chemical functional groups. These rotations, at all polarizable bonds whether they are at potential reaction sites or not, create highly efficient and productive motion and collisions between all of the molecules in the irradiation path.

This method of heating would normally not be generally practical for some commercial uses due to the nodes of high and low energy distribution in any electromagnetic field including microwaves. Commercial fixed-frequency, multi-mode microwave heating systems are well known for spatial non-uniformity in large cavities and for the tendency to initiate arcing and other deleterious effects when metallic materials are processed. However, these effects can be mitigated when necessary through the use of Variable Frequency Microwaves (VFM) as taught, inter alia, in U.S. Pat. Nos. 5,738,915 and 5,879,756, the entire disclosures of which are incorporated herein by reference. VFM has allowed MW curing to become commercially useful in many more industrial applications by creating highly uniform fields without risk of metal arcing.

The manipulation of reaction temperatures using microwaves has been found to be consistently useful in the lowering of the measured reaction (or "cure") temperature in bulk materials without special chemical modification. Unmodified polyamic acid resins that are fully imidized in conventional ovens above 375° C., can be fully imidized with MW at temperatures as low as 200° C. [see R. Hubbard, Z. Fathi, I. Ahmad, H. Matsutani, T. Hattori, M. Ohe, T. Ueno, C. Schuckert, "Low Temperature Curing of Polyimide Wafer Coatings", *Proceedings of the International Electronics and Manufacturing Technologies*, (2004), and R. Hubbard, "Reduced Stress and Improved 2.5D and 3DIC Process Compatibility With Stable Polyimide Dielectrics", *Proceedings of the International Wafer Level Packaging Conference*, Nov. 4-7, 2013, San Jose, Calif., for further background information].

The majority of polyimides used as dielectric coatings on wafers in the microelectronics industry have photosensitive properties, which allow them to be directly patterned without the additional steps of photoresist coating, mask exposure, development, and removal [see K. Horie and T. Yamashita, "Photosensitive Polyimides—Fundamentals and Applications", Lancaster, Pa., Technomic Publishing Co., Inc., pp. 15-18 (1995)]. This useful property is accomplished by the modification of some sites of the polyamic acid (PAA) precursor resin with a photosensitive methacrylate alcohol to form a photosensitive polyamic ester (PAE) as shown in FIG. 1. The alcohol depicted is one or more in the methacrylate family ($R-CH_2CH_2OC(O)CH=C(CH_3)_2$) of monomers and oligomers that is known to crosslink by UV light exposure and forms the basis of many photoresist material families.

Now the PAA/PAE copolymer can be directly photo patterned like a conventional photoresist. As shown schematically in FIG. 1, areas exposed to light through mask openings are crosslinked at the photoactive group "R" creating areas that are less soluble in developer solutions. The more soluble areas are removed by the developer leaving high resolution patterns. The "curing" of photosensitive polyimide films now involves (1) the imidization (or ring closure) reaction step, and (2) the release of the acrylate residue by-product of that imidization as shown schematically in FIG. 2. Removal of the acrylate residue is subsequently achieved at the same 375° C. soak temperature.

The chemistry of the acrylate residuals involves decomposition reactions at temperatures typically in excess of 350° C. for extended times of at least an hour depending on the extent of residue removal required [see M. Zussman and R. Hubbard, "Rapid Cure of Polyimide Coatings for Packaging Applications", Proceedings of The 13th Symposium on Polymers for Microelectronics, Wilmington, Del., (2008)]. At the lower curing temperature of 350° C. for an hour, it was found as expected that the convection process did not remove substantial amounts of the acrylate residue while the VFM process appeared to remove almost all of the residues. In FIG. 3 the remaining acrylate residue peak is shown in the Dynamic Mechanical Analysis (DMA) of the convection cured sample but not in the VFM cured sample. The Thermal Gravimetric Analysis (TGA) in FIG. 4 displays a 1% weight loss at a much higher temperature for VFM (487° C., top curve) than for convection cure (376° C., bottom curve) which corroborates the DMA conclusions [M. Zussman and R. Hubbard, "Rapid Cure of Polyimide Coatings for Packaging Applications", Proceedings of The 13th Symposium on Polymers for Microelectronics, Willmington, Del. (2008)].

It is very important to carry out the conventional high temperature decomposition reactions with a low level of oxygen (<100 ppm), in order to avoid oxidative degradation of the surface of the desired polyimide dielectric film. Decomposition of the polyimide backbone degrades the required electrical properties of the dielectric film as well as producing a brittle dark film.

OBJECTS AND ADVANTAGES

Objects of the present invention include the following: providing a method for curing photosensitive polymers; providing a process that allows lower thermal budgets for energy savings in manufacturing; providing a process that allows previous or subsequent processing steps to be done at lower temperatures; providing a method for curing polymers while protecting any temperature sensitive components or materials; and providing a processing method for polymer films that reduces stress in materials that has a direct proportional relationship between stress and temperature. These and other objects and advantages of the invention will become apparent from consideration of the following specification, read in conjunction with the drawings.

SUMMARY OF THE INVENTION

According to one aspect of the invention, a method for curing photosensitive polyimide (PSPI) films comprises the steps of:
depositing a PSPI film on a selected substrate; and,
curing the film by microwave heating at a selected temperature from about 200 to 275° C. in a selected atmosphere containing an oxygen concentration from about 20 to 200,000 ppm.

According to another aspect of the invention, a method for curing photosensitive polyimide (PSPI) films comprises the steps of:
depositing a PSPI film on a selected substrate;
photopatterning the PSPI film;
developing the photopatterned PSPI film; and,
curing the developed film by microwave heating at a selected temperature from about 200 to 275° C. in a selected atmosphere containing an oxygen concentration from about 20 to 200,000 ppm.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

DETAILED DESCRIPTION OF THE INVENTION

In order to better understand and control the processing of PSPI films on silicon wafers, Applicants conducted a series of experiments In a comparison of standard convection oven and microwave (VFM) curing, a commercial photosensitive polyimide (PSPI) film [HD4100, HD MicroSystems, Wilmington, Del.] was deposited as a 5 μm thick film on a standard silicon wafer. For this example thickness, a coating was spun on for 30 seconds at 4000 rpm and soft-baked at 90° C. for 100 seconds plus 100° C. for 100 seconds. Films were then treated by either VFM or convection heating for various times at various temperatures. It can be seen in FIG. 5 that the extent of imidization reaction becomes complete at temperatures as low as 200° C. with VFM compared with the standard convection process at 375° C. Since the oxidation of the polyimide chains is known to substantially occur only above about 300° C., it was not necessary to use a low oxygen environment at these lower temperature cure conditions.

Figure 6:
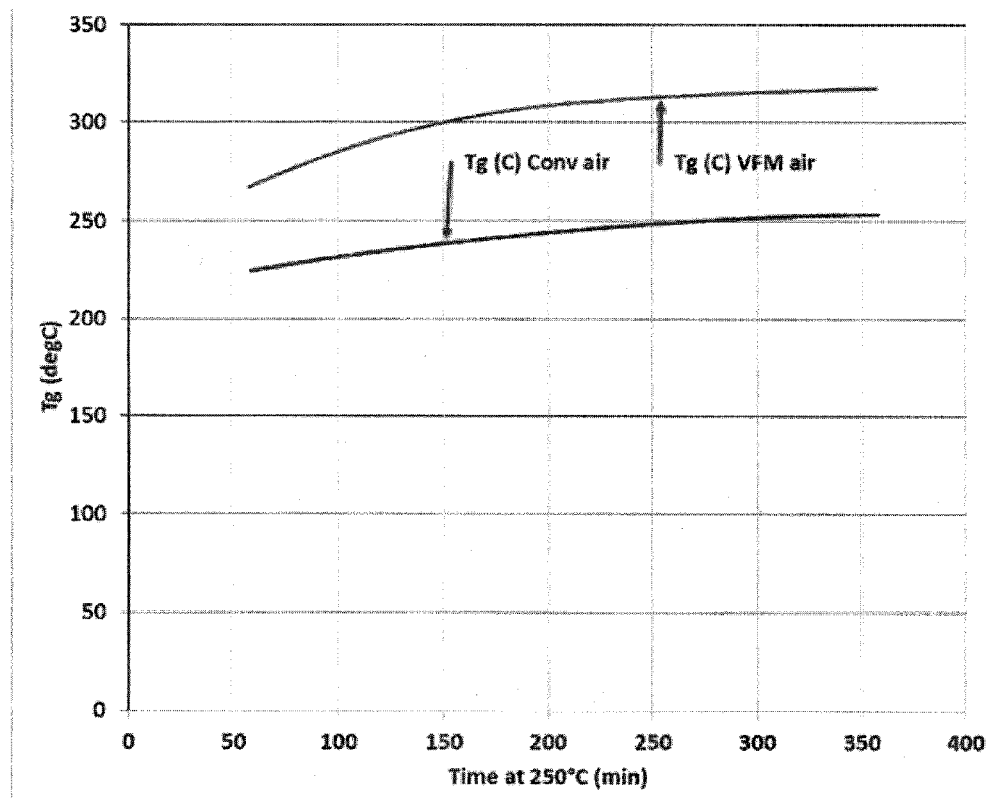
FIG. 6 compares the results of TMA showing that MW curing gives a higher $T_g$ than convection curing.

A surprising result was obtained when evaluating the removal of acrylate residue at these very low cure temperatures in an air environment. Removal of most of the acrylate residue produces a glass transition temperature ($T_g$) of 315-325° C. as determined by penetration mode Thermal Mechanical Analysis (p-TMA) for the same PSPI. As shown in FIG. 6, the $T_g$ of the 250° C. convection cured samples seem to be limited to around 250° C. even after six hours which indicates a low level of acrylate removal. By contrast, the $T_g$ of the 250° C. VFM cured samples indicates substantial to complete removal of the acrylate residues within a very practical time.

However, when attempting to conduct this process in a very low-oxygen environment, which is more typical of standard semiconductor processing, the results were not replicated; specifically, the excellent removal of acrylate residues at low cure temperatures did not occur reliably. Applicants therefore speculated that a controlled amount of oxygen might be useful to drive the acrylate removal, and controlled amounts of oxygen were therefore added to the process.

It is important to note that adding oxygen would normally be very deleterious in the conventional (convection heated) process, because at conventional processing temperatures (~375° C.) there would be oxidative decomposition of the polyimide backbone, which would degrade film properties. By contrast, the inventive use of oxidation to assist the decomposition of acrylate resins at the lower cure temperatures characteristic of the VFM process (~250° C.) is very unlikely to induce oxidative decomposition of the polyimide backbone, and in fact none of the VFM-cured samples in FIG. 6 displayed the characteristic darkening of the films that would be symptomatic of polyimide decomposition. In addition, Applicants have not found any evidence that microwave energy at temperatures below 300° C. causes decomposition of any of these thermoplastic materials.

The role of oxygen in the decomposition of the acrylate residues is also supported by data collected during the high temperature (340° C.) VFM cure evaluations shown in FIGS. 7 and 8. Clearly having small amounts of oxygen present during the VFM cure or by adding additional oxygen flow substantially increases the $T_g$ of the films as a result of acrylate removal. Since no evidence has been found of the oxidation of the polyimide backbone at these VFM cure temperatures it is most likely that oxidation occurs preferentially at the aliphatic acrylate residues rather than at the primarily aromatic polyimide backbone structures. This preserves the required electrical and mechanical properties of the cured polyimide films.

Since the low activation energies found in microwave induced chemical reactions have not been found to cause thermal decomposition, when oxygen is available to the sensitive radical-generating acrylate residues during VFM curing there might be an autoxidation effect that progressively causes oxidation of the alkyl portions of the acrylate and then releases carbon dioxide and other gases to complete the removal of these residues from the PSPI films at such surprisingly low temperatures.

The surprising combination of low temperature VFM curing with oxygen assist makes available for the first time a practical way to fully cure at very low temperatures, including acrylate removal, photo-sensitive polyimide films that are currently the most commonly used polymer dielectric material within the microelectronics industry. The addition of oxygen (in air or with flow) appears to have no negative effects on the films at these temperatures. Low temperature cure enables the advantages listed above including the protection of temperature sensitive materials and processing steps and lower stressed films.

Example

Figure 5:
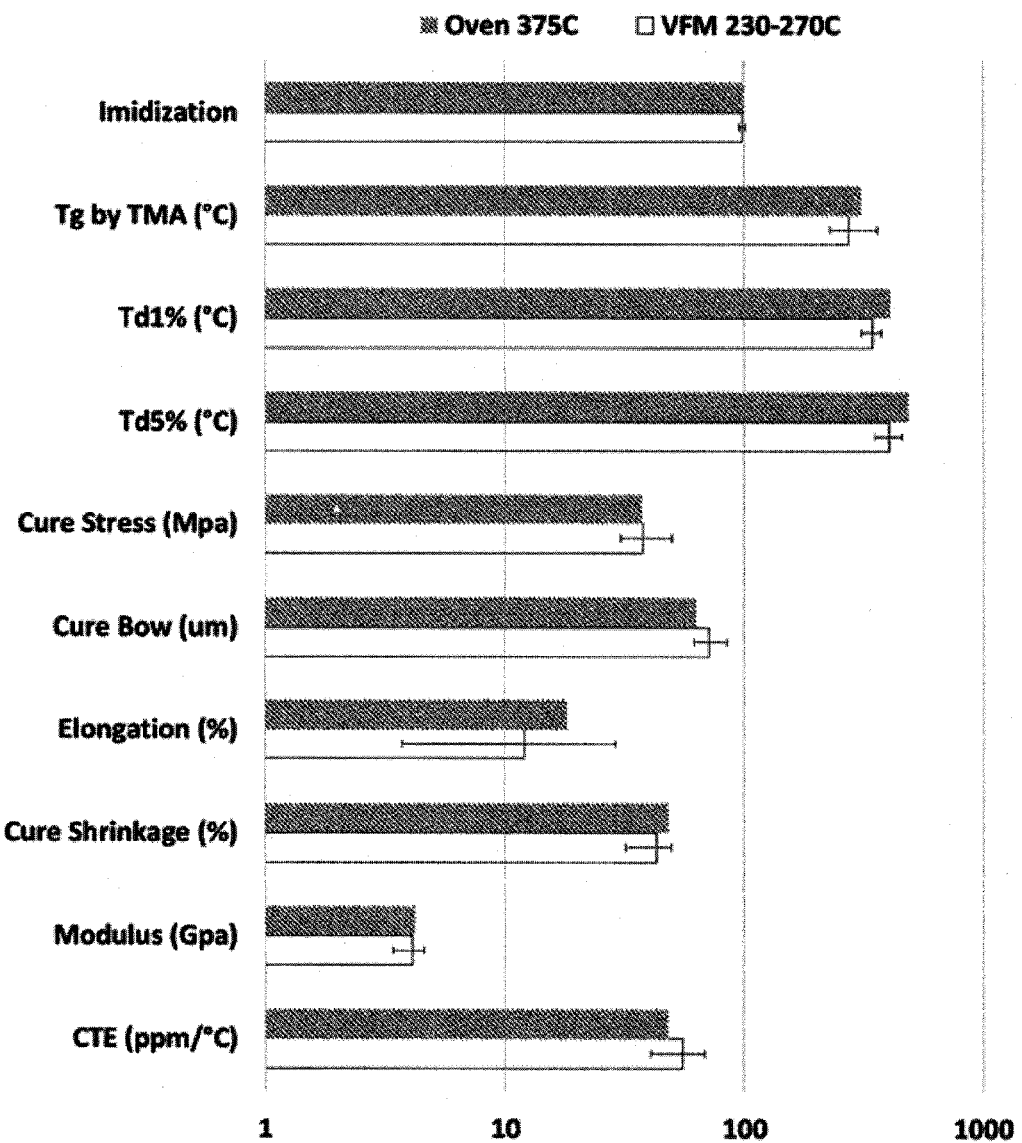
FIG. 5 compares the results of imidization by convection versus MW cure of PSPI films on silicon wafers.

As shown with a specific example in FIG. 5, VFM processing of PSPI films on silicon wafers achieves substantially identical film properties with cure temperatures from about 230 to 270° C. and times from about 60 to 180 minutes. Under those conditions, oxygen may be safely introduced without damaging the polyimide.

In contrast, the same level of imidization requires convection heating to 375° C. for 300 minutes. Under those conditions with oxygen, oxidative damage to the polyimide would occur.

Example

As shown in FIG. 6, VFM cured PSPI films have significantly higher $T_g$ than convection cured films after processing at comparable temperatures (250° C.) over the entire range from about 50 to 350 minutes.

Example

Figure 7:
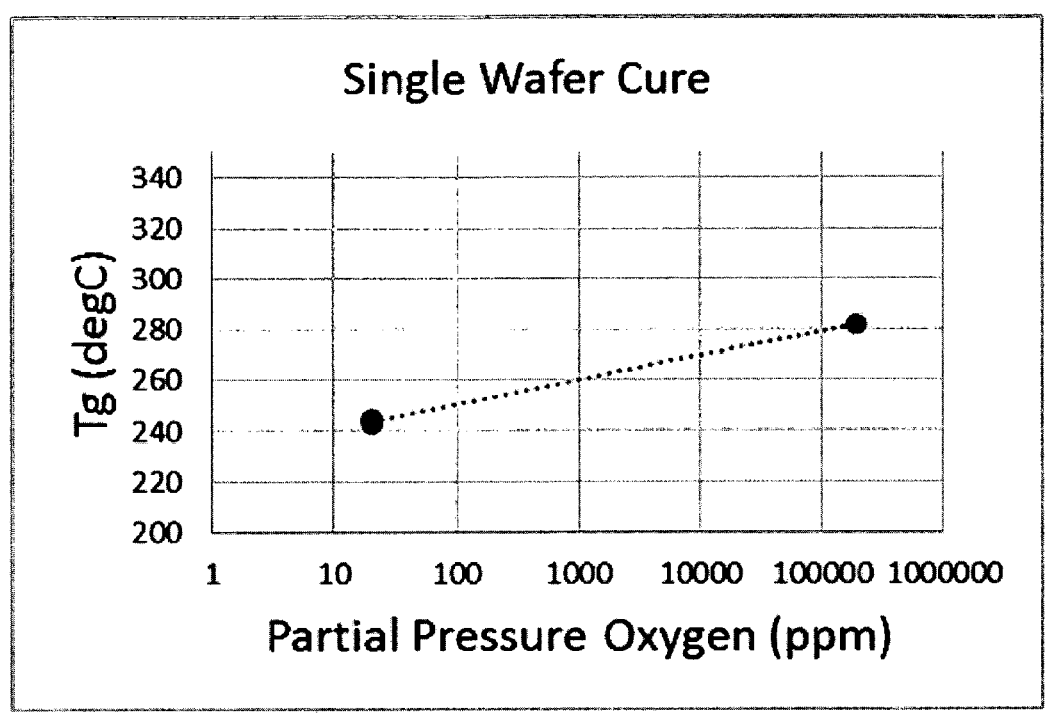
FIG. 7 shows the effect of oxygen partial pressure on MW curing of PSPI films.

As shown in FIG. 7, VFM curing at 340° C. at oxygen partial pressures from about 20 to 200,000 ppm leads to $T_g$ values from about 240 to 280° C. as measured by DMA.

Figure 8:
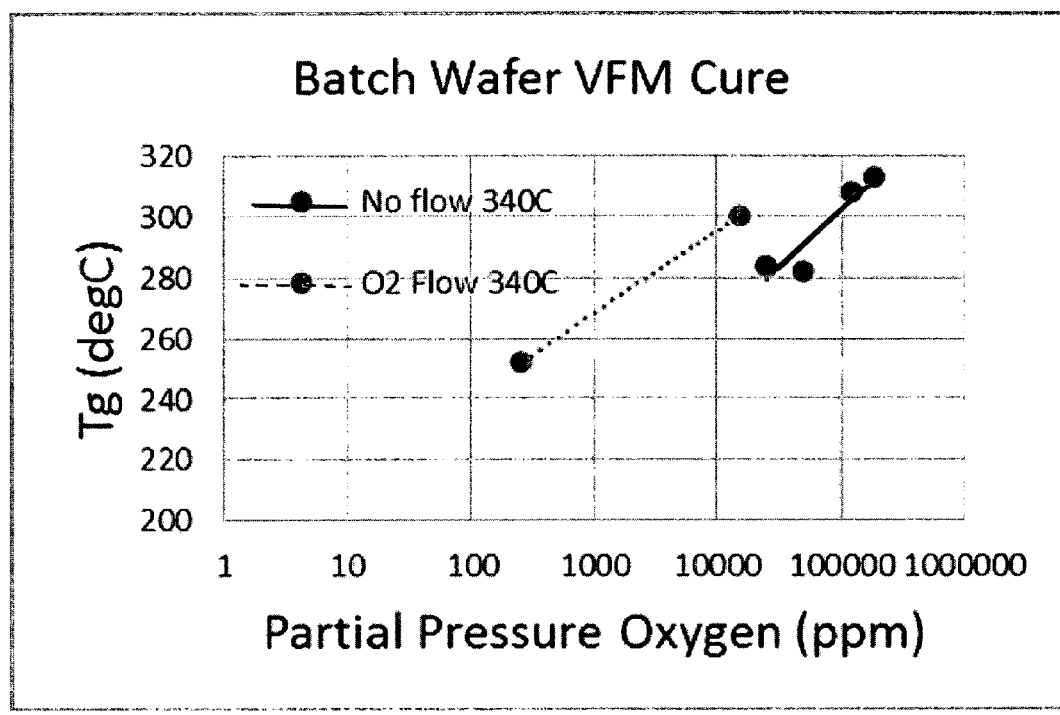
FIG. 8 shows the effect of oxygen partial pressure on MW curing of PSPI films using a batch wafer VFM process.

As shown in FIG. 8, using batch wafer VFM cure at 340° C., in either static (right curve) or flowing (left curve) atmospheres containing oxygen at concentrations from about 200 to 200,000 ppm, produces films with $T_g$ values ranging from about 250 to 320° C. The oxygen values here represent oxygen concentrations in a carrier gas (typically nitrogen) at nominally one atmosphere, and it will be appreciated that the highest value essentially represents air. In general, Applicants prefer to use oxygen diluted in a carrier gas rather than the equivalent of using pure oxygen at a reduced pressure to achieve the same effective oxygen activity, simply because operating at ambient pressure is simpler and less maintenance intensive. However, in some circumstances it may be desirable to operate at pressures other than ambient, and the skilled artisan can adjust chamber pressure and oxygen concentration independently or together in order to maintain a desired level of oxygen activity equivalent to that of 20 to 200,000 ppm mixtures at ambient pressure. Any means of achieving oxygen activities in this range are considered to be within the scope of the present invention. For example, an effective oxygen concentration of 200,000 ppm may be maintained using air at 1 atmosphere, or pure oxygen at 0.2 atmosphere, or some other combination.

Although Applicants prefer to use VFM processing because of the ease of creating a highly uniform power density throughout a large processing volume, it will be appreciated that in some instances fixed-frequency MW curing may be used, for example if the component to be processed is small and/or a single-mode cavity is used to create a uniform energy density over a selected working volume. Furthermore, Applicants do not intend to limit themselves to any particular type of microwave system or microwave generator.

It will be further understood that the discussion of particular commercial film-forming materials deposited on silicon wafers is exemplary only and is not intended to limit the invention to the use of silicon as the substrate nor to limit the invention to any particular manufacturer's PSPI material or any particular manufacturer's photosensitive polymer.

Figure 1:
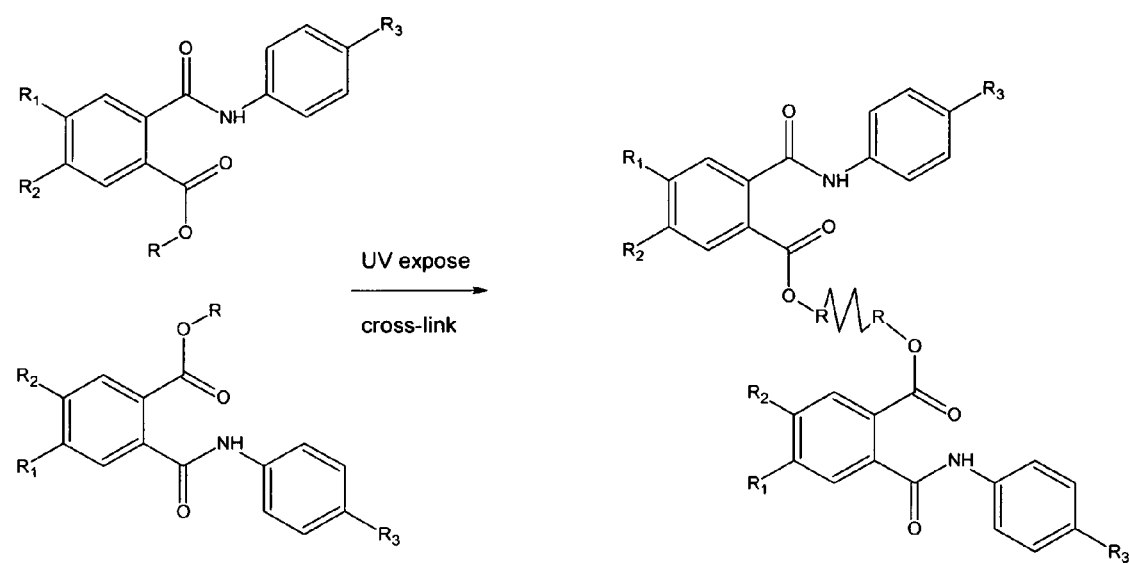
FIG. 1 is a schematic diagram of the modification of polyamic acid by the addition of a methacrylate group to create a photosensitive polyamic ester.
Figure 2:
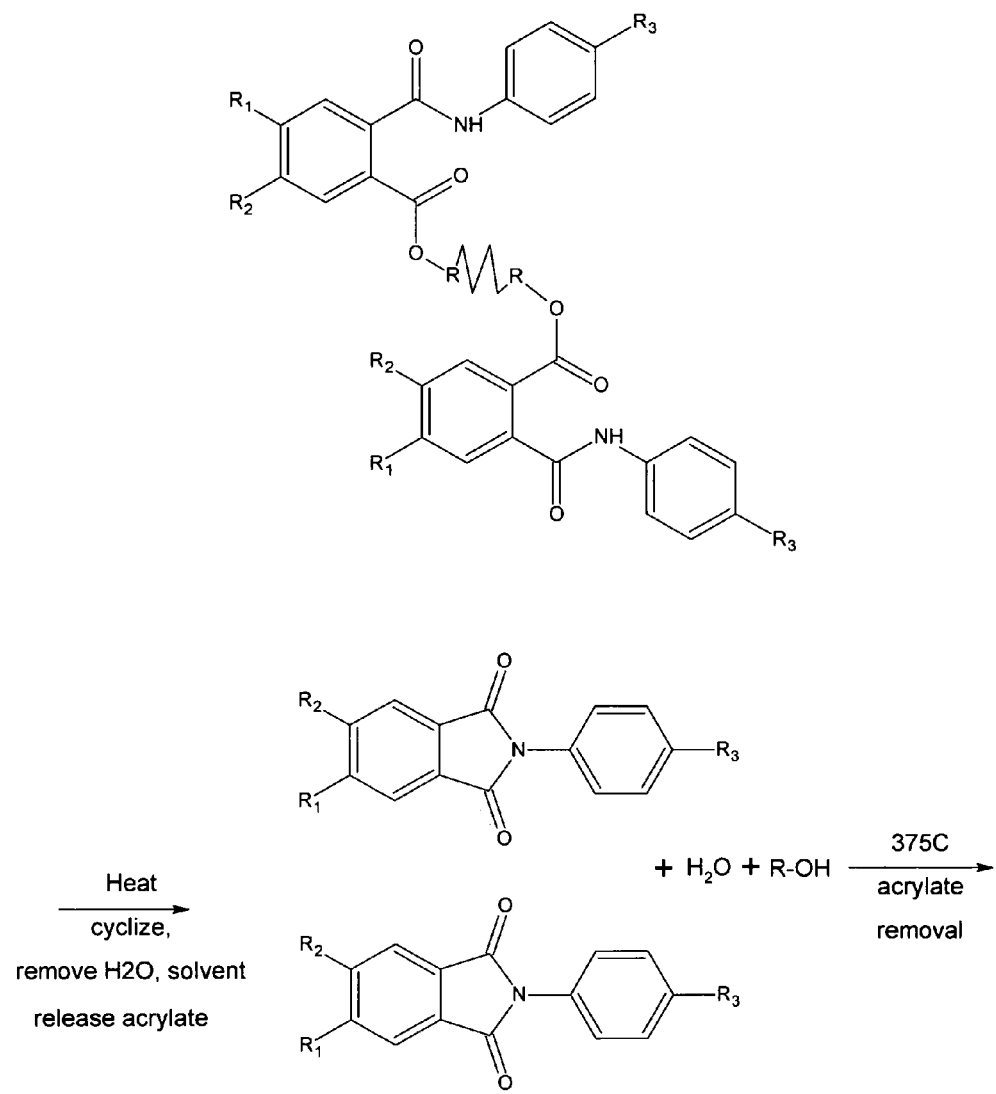
FIG. 2 is a schematic diagram of the processing steps on a polyamic ester for imidization and acrylate removal.
Figure 3:
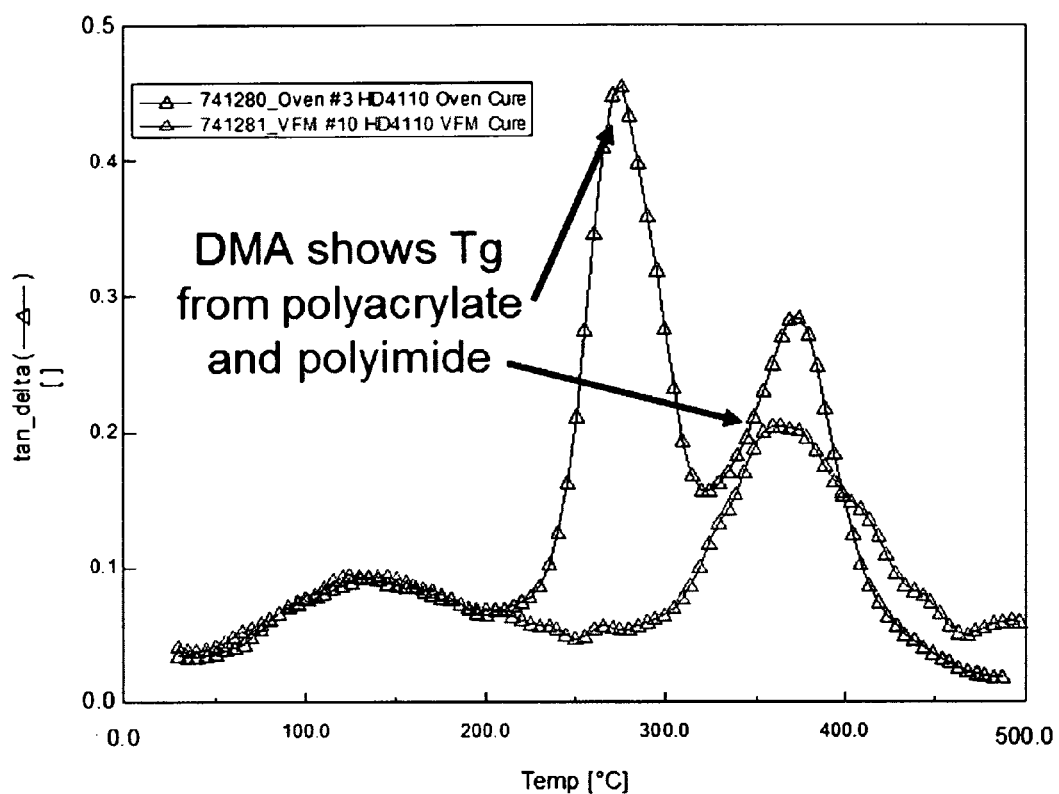
FIG. 3 is a comparison of DMA data for oven-cured and microwave cured films, showing that MW curing effectively eliminates the residual polyacrylate.
Figure 4:
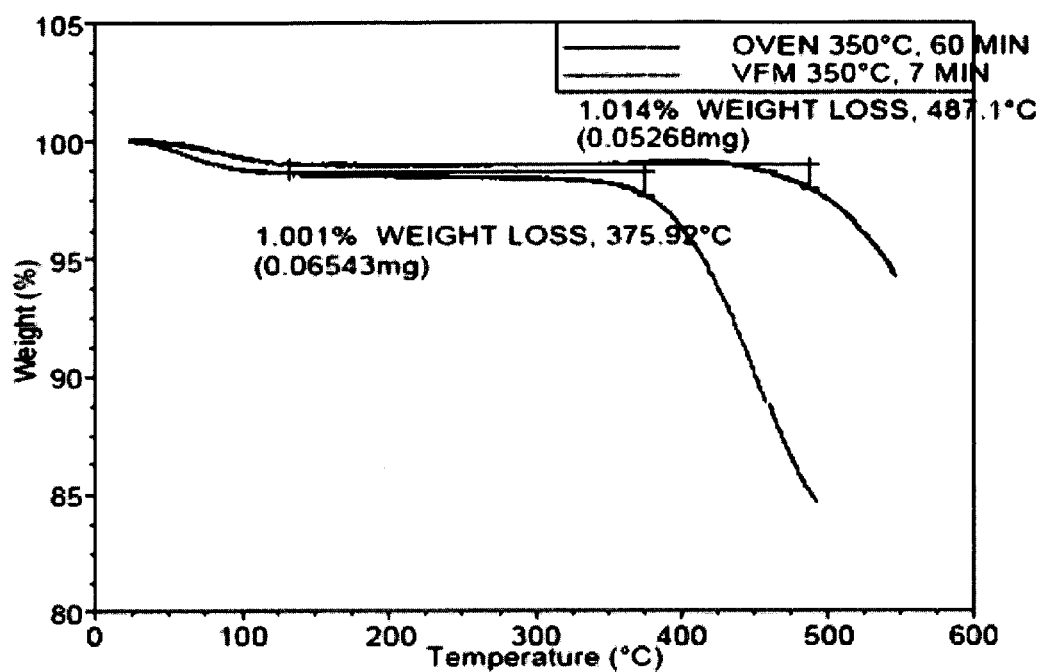
FIG. 4 is a comparison of TGA data for cured photosensitive polyimide films, showing that the MW cured film has a 1% weight loss at a much higher temperature than does the convection-cured sample.

The invention may be applicable to many chemical systems analogous to the specific example compositions described herein. Specifically, as noted, compositions may involve the modification of some sites of the polyamic acid (PAA) precursor resin with a photosensitive methacrylate alcohol to form a photosensitive polyamic ester (PAE) as shown in FIG. 1. The alcohol depicted is one or more in the methacrylate family (R—$CH_2CH_2OC(O)CH=C(CH_3)_2$) of monomers and oligomers that is known to crosslink by UV light exposure and forms the basis of many photoresist material families. As used herein, R indicates any selected organic moiety attached at the indicated position.

It will further be appreciated that the invention may be more generally applied to other photosensitive chemistries, for example, polybenzoxazoles (PBO), provided that the photosensitive moiety is at least partially removable during subsequent processing and does not form a permanent part of the polymer backbone.

We claim:

1. A method for curing photopolymer films comprising the steps of:
   depositing a photopolymer film on a selected substrate; and,
   curing the photopolymer film by microwave heating for a selected time at a selected temperature from about 200 to about 340° C. in a selected atmosphere containing an oxygen concentration in the range from about 20 to 200,000 ppm, wherein the oxygen concentration is maintained by at least one of supplying a known amount of oxygen gas ($O_2$) to the atmosphere or adjusting the pressure of the atmosphere.

2. The method of claim 1, wherein the photopolymer is a photosensitive polyimide (PSPI).

3. The method of claim 2 wherein the PSPI comprises a polyamic acid (PAA) precursor resin modified with a photosensitive methacrylate alcohol to form a photosensitive polyamic ester (PAE).

4. The method of claim 3 wherein the methacrylate alcohol comprises one or more compositions in the methacrylate family ($R-CH_2CH_2OC(O)CH=C(CH_3)_2$) of monomers and oligomers, where R indicates any selected organic moiety attached at the indicated position.

5. The method of claim 2 wherein the selected time is from about 60 to about 180 minutes.

6. The method of claim 2 wherein the selected temperature ranges from about 200 to about 275° C.

7. The method of claim 2 wherein the selected atmosphere contains an oxygen concentration in the range from about 200 to 200,000 ppm.

8. The method of claim 1, wherein the photopolymer is a polybenzoxazole (PBO).

9. A method for curing photopolymer films comprising the steps of:
    depositing a photopolymer film on a selected substrate;
    photopatterning the photopolymer film;
    developing the photopatterned photopolymer film; and,
    curing the developed photopolymer film by microwave heating for a selected time at a selected temperature from about 200 to 340° C. in a selected atmosphere containing an oxygen concentration from about 20 to 200,000 ppm, wherein the oxygen concentration is maintained by at least one of supplying a known amount of oxygen gas to the atmosphere or adjusting the pressure of the atmosphere.

10. The method of claim 9, wherein the photopolymer is a photosensitive polyimide (PSPI).

11. The method of claim 10 wherein the PSPI comprises a polyamic acid (PAA) precursor resin modified with a photosensitive methacrylate alcohol to form a photosensitive polyamic ester (PAE).

12. The method of claim 11 wherein the methacrylate alcohol comprises one or more compositions in the methacrylate family ($R-CH_2CH_2OC(O)CH=C(CH_3)_2$) of monomers and oligomers, where R indicates any selected organic moiety attached at the indicated position.

13. The method of claim 10 wherein the selected time is from about 60 to about 180 minutes.

14. The method of claim 10 wherein the selected temperature ranges from about 200 to about 275° C.

15. The method of claim 10 wherein the selected atmosphere contains an oxygen concentration in the range from about 200 to 200,000 ppm.

16. The method of claim 9, wherein the photopolymer is a polybenzoxazole (PBO).

* * * * *